US 8,212,610 B2

(12) United States Patent
Bereza et al.

(10) Patent No.: US 8,212,610 B2
(45) Date of Patent: Jul. 3, 2012

(54) TECHNIQUES FOR DIGITAL LOOP FILTERS

(75) Inventors: William W. Bereza, Nepean (CA);
Mohsen Moussavi, Kanata (CA);
Charles E. Berndt, Nepean (CA)

(73) Assignee: Altera Corporation, San Jose, CA (US)

( * ) Notice: Subject to any disclaimer, the term of this patent is extended or adjusted under 35 U.S.C. 154(b) by 184 days.

(21) Appl. No.: 12/272,266

(22) Filed: Nov. 17, 2008

(65) Prior Publication Data

US 2010/0073054 A1    Mar. 25, 2010

Related U.S. Application Data

(60) Provisional application No. 61/098,694, filed on Sep. 19, 2008.

(51) Int. Cl.
*H03B 1/00* (2006.01)
(52) U.S. Cl. ........ 327/551; 327/147; 327/159; 327/231; 375/373
(58) Field of Classification Search .......... 327/147–150, 327/159, 156–158, 231–235, 241, 551–555; 375/373–376
See application file for complete search history.

(56) References Cited

U.S. PATENT DOCUMENTS

| 4,020,362 | A | * | 4/1977 | Suzuki et al. | 377/105 |
|---|---|---|---|---|---|
| 4,169,991 | A | * | 10/1979 | Ross | 318/599 |
| 5,036,294 | A | | 7/1991 | McCaslin | |
| 5,739,725 | A | * | 4/1998 | Ferraiolo et al. | 331/57 |
| 6,731,147 | B2 | * | 5/2004 | Fiscus | 327/158 |
| 6,903,615 | B2 | | 6/2005 | Landman et al. | |
| 7,184,509 | B2 | * | 2/2007 | Cho et al. | 375/373 |
| 2003/0133522 | A1 | | 7/2003 | Staszewski et al. | |
| 2003/0174003 | A1 | * | 9/2003 | Nogami | 327/156 |
| 2007/0183014 | A1 | * | 8/2007 | Coppola et al. | 359/238 |
| 2007/0188243 | A1 | * | 8/2007 | Waheed et al. | 331/16 |

OTHER PUBLICATIONS

U.S. Appl. No. 12/111,146, filed Apr. 28, 2008, Xiao, et al.
U.S. Appl. No. 12/163,808, filed Jun. 27, 2008, Moussavi, et al.
U.S. Appl. No. 12/168,811, filed Jul. 7, 2008, Moussavi.
Robert Bogdan Staszewski et al., "All-Digital TX Frequency Synthesizer and Discrete-Time Receiver for Bluetooth Radio in 130-nm CMOS," IEEE Journal of Solid-State Circuits, vol. 39, No. 12, Dec. 2004, pp. 2278-2291.
A. V. Rylyakov et al., "A Wide Power-Supply Range (0.5V-to-1.3V) Wide Tuning Range (500 MHz-to-8 GHz) All-Static CMOS AD PLL in 65nm SOI," 2007 IEEE International Solid-State Circuits Conference / Session 9 / Clocking / 9.1, Feb. 13, 2007, pp. 172-173.

* cited by examiner

*Primary Examiner* — Lincoln Donovan
*Assistant Examiner* — Shikha Goyal
(74) *Attorney, Agent, or Firm* — Steven J. Cahill

(57) ABSTRACT

A digital loop filter includes a fine control circuit and a coarse control circuit. The fine control circuit adjusts a phase of a feedback clock signal by a first phase adjustment in response to a first phase error signal that indicates a sign of a phase error between a reference clock signal and the feedback clock signal. The coarse control circuit adjusts the phase of the feedback clock signal by a second phase adjustment in response to a second phase error signal. The second phase adjustment is larger than the first phase adjustment. The second phase error signal indicates a magnitude of a phase error between the reference clock signal and the feedback clock signal.

26 Claims, 10 Drawing Sheets

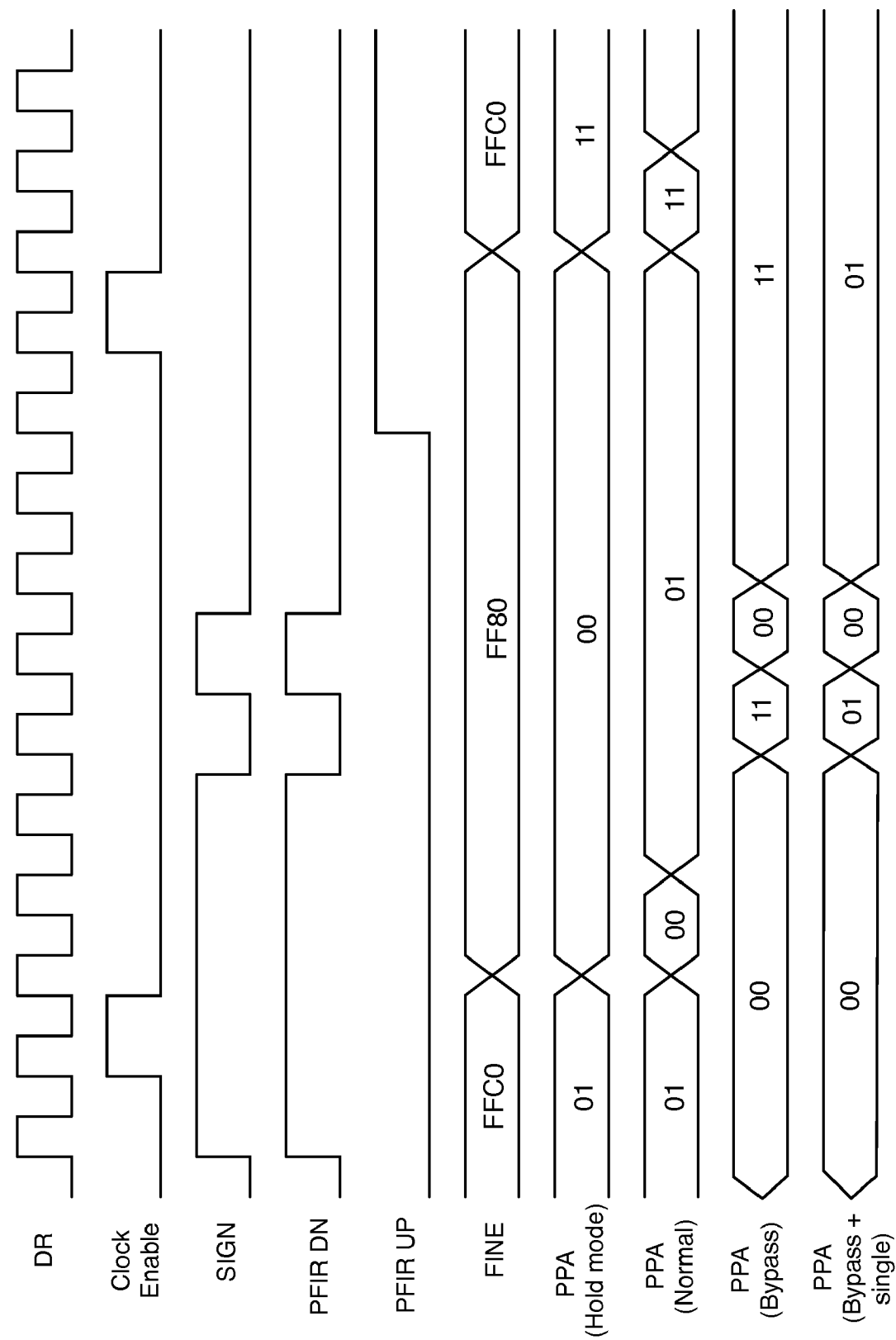

US 8,212,610 B2

TECHNIQUES FOR DIGITAL LOOP FILTERS

CROSS REFERENCE TO RELATED APPLICATION

This patent application claims the benefit of U.S. provisional patent application 61/098,694, filed Sep. 19, 2008, which is incorporated by reference herein.

BACKGROUND OF THE INVENTION

The present invention relates to electronic circuits, and more particularly, to techniques for digital loop filters.

Digital locked loops, such as digital phase-locked loops and digital delay-locked loops, often use a digital loop filter.

BRIEF SUMMARY OF THE INVENTION

According to some embodiments, a digital loop filter includes a fine control circuit and a coarse control circuit. The fine control circuit adjusts a phase of a feedback clock signal by a first phase adjustment in response to a first phase error signal that indicates a sign of a phase error between a reference clock signal and the feedback clock signal. The coarse control circuit adjusts the phase of the feedback clock signal by a second phase adjustment in response to a second phase error signal. The second phase adjustment is larger than the first phase adjustment. The second phase error signal indicates a magnitude of a phase error between the reference clock signal and the feedback clock signal. The present invention includes circuits, systems, and methods for performing the embodiments described herein.

Various objects, features, and advantages of the present invention will become apparent upon consideration of the following detailed description and the accompanying drawings.

BRIEF DESCRIPTION OF THE DRAWINGS

FIG. 6C is a decimated timing diagram that illustrates example waveforms for various signals in the DLF of FIG. 3, according to an embodiment of the present invention.

DETAILED DESCRIPTION OF THE INVENTION

Figure 1:
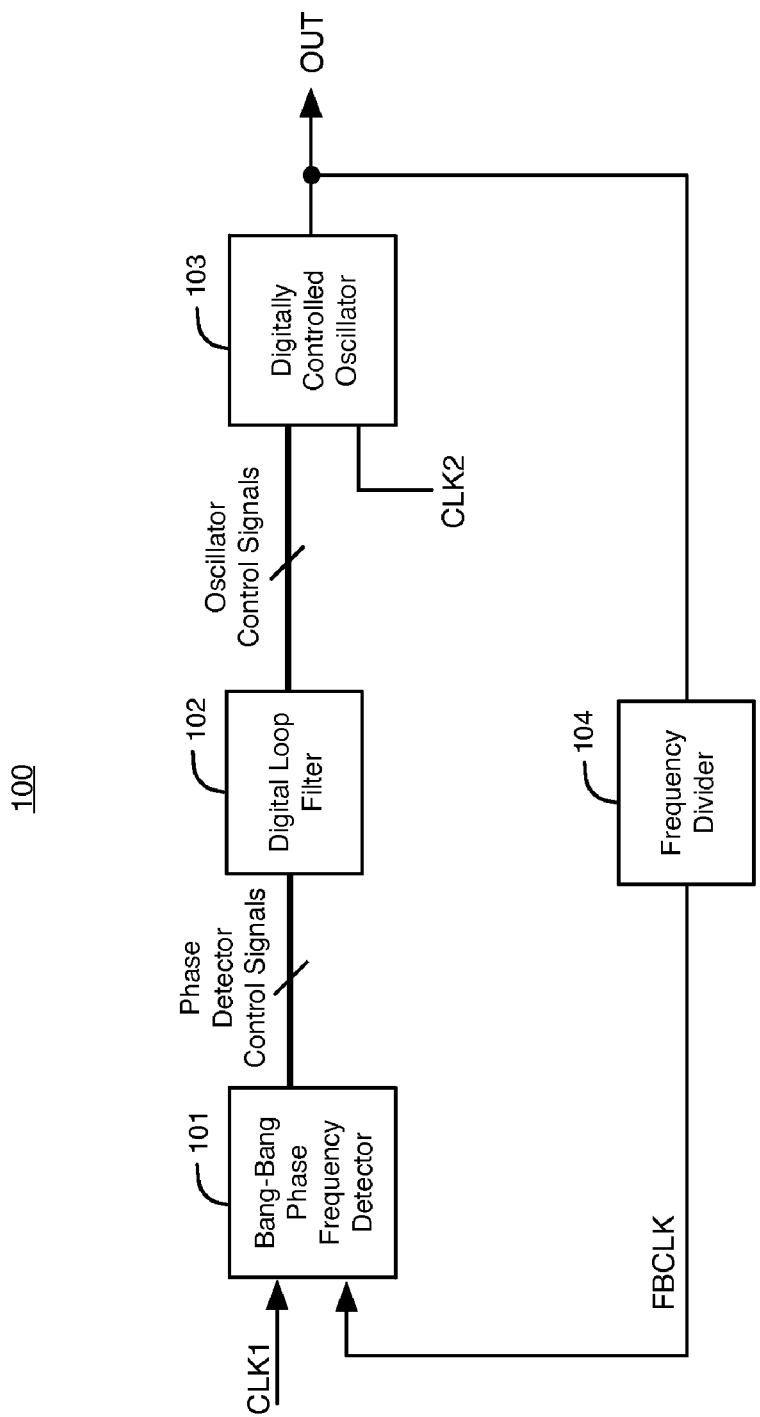
FIG. 1 illustrates an example of a digital phase-locked loop (PLL), according to an embodiment of the present invention.

FIG. 1 illustrates an example of digital phase-locked loop (PLL) circuit 100, according to an embodiment of the present invention. PLL 100 includes bang-bang phase frequency detector (BBPFD) circuit 101, digital loop filter 102, digitally controlled oscillator (DCO) 103, and frequency divider circuit 104. PLL 100 is typically fabricated on an integrated circuit, such as a programmable logic integrated circuit or an application specific integrated circuit (ASIC). Programmable logic integrated circuits include field programmable gate arrays (FPGAs) and programmable logic devices (PLDs).

Bang-bang phase frequency detector 101 compares the phase of an input reference clock signal CLK1 to the phase of a feedback clock signal FBCLK generated by frequency divider circuit 104. Frequency divider circuit 104 is a counter circuit that divides the frequency of a periodic output clock signal OUT from DCO 103 to generate the frequency of the feedback clock signal FBCLK. Phase frequency detector 101 generates digital phase detector control signals having logic states that are indicative of any phase and/or frequency difference between clock signals CLK1 and FBCLK.

Digital loop filter 102 filters the phase detector control signals from phase frequency detector 101 to generate oscillator control signals that are transmitted to input terminals of digitally controlled oscillator (DCO) 103. DCO 103 also receives an input clock signal CLK2. Clock signals CLK1 and CLK2 in FIG. 1 can be the same periodic signal having the same frequency or two different periodic signals having different frequencies. DCO 103 generates a periodic output clock signal OUT in response to the oscillator control signals and clock signal CLK2. DCO 103 varies the frequency of clock signal OUT in response to changes in the oscillator control signals.

Figure 2:
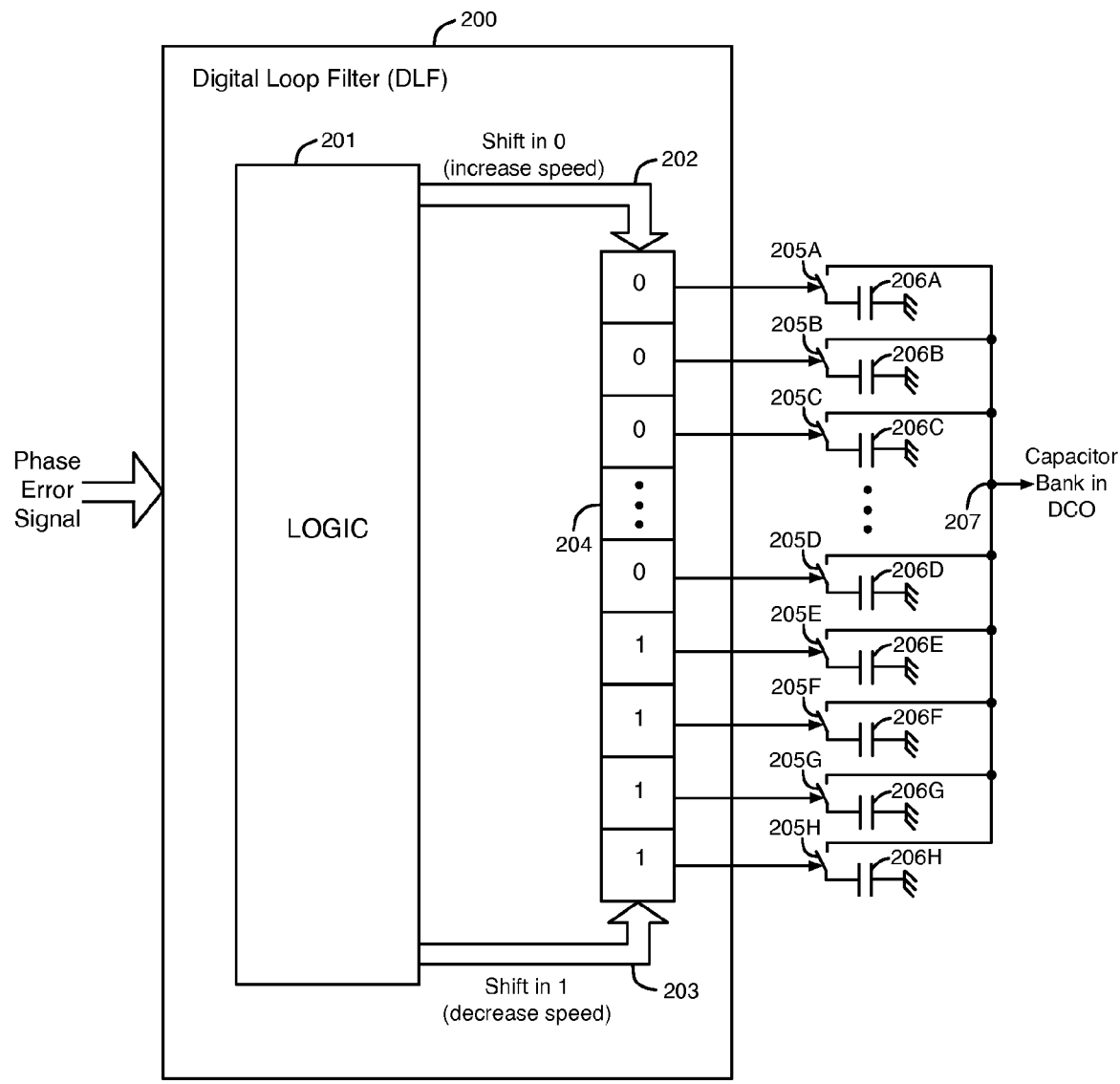
FIG. 2 is a simplified partial block diagram that illustrates an example of a digital loop filter (DLF), according to an embodiment of the present invention.

FIG. 2 is a simplified partial block diagram that illustrates an example of a digital loop filter (DLF) 200, according to an embodiment of the present invention. Digital loop filter (DLF) 200 is an example of the digital loop filter 102 in PLL 100. Thus, DLF 200 can be used in a digital phase-locked loop such as PLL 100.

DLF 200 includes logic block 201 and shift register 204. FIG. 2 also illustrates 8 switches 205A-205H and 8 capacitors 206A-206H. Switches 205 and capacitors 206 are located in a capacitor bank in a digitally controlled oscillator, such as DCO 103. 8 capacitors 206 and 8 switches 205 are illustrated in FIG. 2 as an example. The DCO can have any suitable number of capacitors and switches.

DLF 200 controls the conductive states of switches 205A-205H in the DCO. Each switch 205 is coupled to a corresponding capacitor 206 as shown in FIG. 2. Each capacitor 206 is coupled between a switch 205 and a terminal that receives a ground voltage. A switch 205 is closed to couple the corresponding capacitor 206 to a common node 207 in the DCO. A switch 205 is opened to decouple the corresponding capacitor 206 from the common node 207.

DLF 200 closes more of switches 205A-205H causing more of capacitors 206A-206H to be coupled together in parallel to increase the capacitance at node 207. DCO 103 decreases the phase and frequency of its output clock signal OUT when the capacitance at node 207 increases. DLF 200 opens more of switches 205A-205H causing less of capacitors 206A-206H to be coupled together in parallel to decrease the capacitance at node 207. DCO 103 increases the phase and frequency of its output clock signal OUT when the capacitance at node 207 decreases. Capacitors 206A-206H can be part of a varactor in DCO 103.

Shift register 204 in DLF 200 contains a set of flip-flops that are represented by squares in FIG. 2. The number of flip-flops in shift register 204 equals the number of switches 205 in DCO 103. Each flip-flop stores a one bit (i.e., a logic high state) or a zero bit (i.e., a logic low state). A signal representing the logic state stored in each flip-flop in register 204 is transmitted to DCO 103 to control the conductive state of one of the switches 205A-205H without any binary conversion. Each flip-flop in register 204 controls a different one of the switches 205A-205H.

If the phase of the feedback clock signal FBCLK arrives later in time than the phase of the input reference clock signal CLK1, bang-bang phase frequency detector 101 causes a phase error signal to have a first logic state. DLF 200 receives the phase error signal from phase frequency detector 101. The phase error signal is transmitted to DLF 102/200 as part of the phase detector control signals. When the phase error signal is in the first logic state, DLF 200 generates a signal 202 that serially shifts more zero bits into shift register 204 from the topside of register 204 down, with respect to the orientation of FIG. 2. Signal 202 causes the total number of zero bits stored in shift register 204 to increase. When the number of zero bits stored in register 204 increases, more of switches 205 open, causing the capacitance at node 207 to decrease. In response to the reduced capacitance at node 207, DCO 103 increases the phase and frequency of output clock signal OUT, which causes the phase and frequency of FBCLK to increase (i.e., the clock transitions occur earlier in time). This operation in time, by the feedback action of the phase-locked loop 100, drives the phase error between CLK1 and FBCLK towards zero.

If the phase of the feedback clock signal FBCLK arrives earlier in time than the phase of the input reference clock signal CLK1, bang-bang phase frequency detector 101 causes the phase error signal to have a second logic state. When the phase error signal is in the second logic state, DLF 200 generates a signal 203 that serially shifts more one bits into shift register 204 from the bottom side of register 204 up, with respect to the orientation in FIG. 2. Signal 203 causes the total number of one bits stored in shift register 204 to increase. When the number of one bits stored in register 204 increases, more of switches 205 close, causing the capacitance at node 207 to increase. In response to the increased capacitance at node 207, DCO 103 decreases the phase and frequency of output clock signal OUT, which causes the phase and frequency of FBCLK to decrease (i.e., the clock transitions occur later in time). This operation in time, by the feedback action of the phase-locked loop 100, drives the phase error between CLK1 and FBCLK towards zero.

By definition, phase is the mathematical integral of frequency. An increase in frequency for a short period of time advances the phase of the output clock signal OUT of DCO 103 until the phase error between CLK1 and FBCLK is reduced.

The architecture of FIG. 2 avoids arithmetic operations and code conversions, such as multiplications and additions, to help reduce the circuit complexity as well as the power consumption of the circuit. These goals are accomplished through an architecture that is based on accumulation using shift register 204.

According to some embodiments, a non-linear digital loop filter is provided that has low complexity. The closed-loop system is nonlinear, because bang-bang phase frequency detector 101 in PLL 100 is nonlinear. The phase error signal generated by phase frequency detector 101 is quantized to either a "lead" or "lag" signal. For example, a logic low state in the phase error signal may represent a lead signal, and a logic high state in the phase error signal may represent a lag signal. The logic state of the phase error signal indicates whether the phase of the FBCLK signal is ahead of the phase of the CLK1 signal or behind the phase of the CLK1 signal.

If the difference between the phases and/or frequencies of the FBCLK and CLK1 clock signals is large, digital loop filter 200 applies more corrective action, but not in a linear fashion. Thus, DLF 200 is nonlinear. DLF 200 includes both a proportional path and an integration path. Generally, the outputs of the proportional and integration paths are summed together at the output of filter 200. In filter 200, the integration path is used to achieve a large frequency range, while the proportional path is used to stabilize the loop by providing a degree of phase lead correction.

Figure 3:
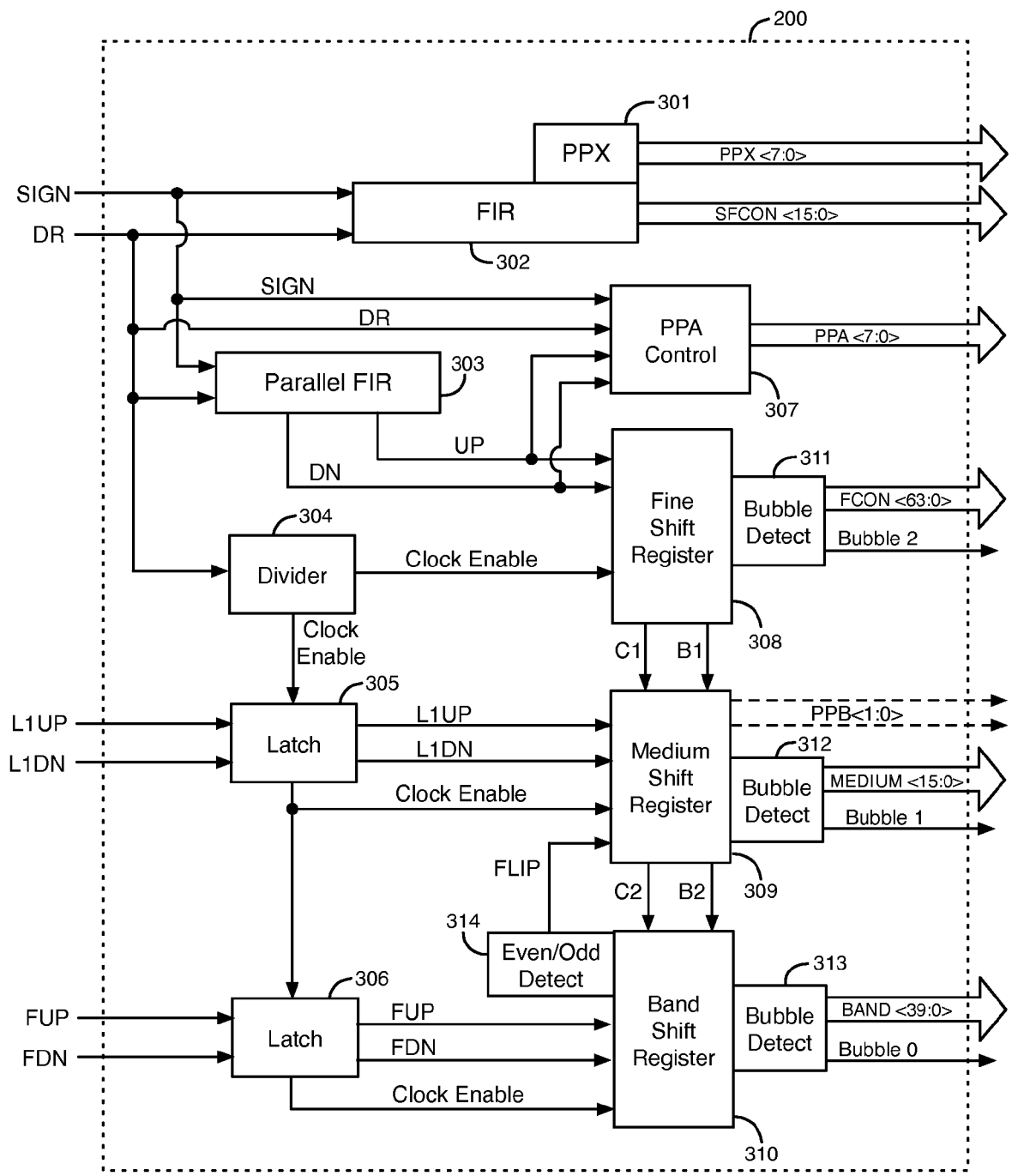
FIG. 3 is a more detailed diagram of a digital loop filter (DLF), according to an embodiment of the present invention.

FIG. 3 is a more detailed diagram of digital loop filter (DLF) 200, according to an embodiment of the present invention. DLF 200 in FIG. 3 includes PPX block 301, serial finite impulse response (FIR) filter 302, parallel finite impulse response (PFIR) filter 303, frequency divider circuit 304, latch 305, latch 306, PPA control block 307, fine shift register 308, medium shift register 309, band shift register 310, bubble detect blocks 311-313, and even/odd detector 314.

DLF 200 receives several digital input signals from phase frequency detector 101. The digital input signals are referred to as the phase detector control signals in FIG. 1. DLF 200 generates several digital output signals in response to the digital input signals.

The phase detector control signals that are transmitted to DLF 200 as the digital input signals include the SIGN signal, the DR signal, the L1UP signal, the L1DN signal, the FUP signal, and the FDN signal. The SIGN signal indicates whether the phase error is positive (SIGN=1) or negative (SIGN=0). The SIGN signal is also referred to as the phase error signal above. For example, the SIGN signal may indicate a "1" (i.e., in a logic high state) when the logic state transition of the FBCLK clock signal occurs later in time than the corresponding logic state transition of the CLK1 clock signal. Using this example, the SIGN signal indicates a "0" (i.e., in a logic low state) when the logic state transition of the FBCLK signal occurs earlier in time than the corresponding logic state transition of the CLK1 signal.

The data ready (DR) signal is a protocol signal indicating to DLF 200 that a phase comparison has been made between CLK1 and FBCLK and that the data embodied in the SIGN signal is ready to be read by DLF 200. The active edge of the DR signal indicates when the phase error signal (i.e., the SIGN signal) is ready to be processed by DLF 200. The DR signal can be used as a clock signal for driving all synchronous operations within digital loop filter 200. The DR signal can be the input reference clock signal CLK1 or a signal that is derived from input reference clock signal CLK1.

BBPFD 101 asserts signals L1DN and L1UP when the phase difference between the CLK1 and the FBCLK clock signals is large. For example, signals L1DN and L1UP may be asserted when the phase difference between the CLK1 and FBCLK signals is greater than 90 degrees. In this example, the L1UP signal is asserted when the phase of FBCLK is more than 90 degrees behind the phase of CLK1, and the L1DN signal is asserted when the phase of FBCLK is more than 90 degrees ahead of the phase of CLK1.

DLF 200 increases the rate of convergence between the phases of CLK1 and FBCLK in response to one of the L1UP and L1DN signals being asserted when the locking process is under way. Because loop filter 200 is responsive to the SIGN and the L1UP/L1DN signals, loop filter 200 is nonlinear in terms of its coarse transfer function.

The FDN and FUP signals are asserted to denote that PLL 100 is in need of frequency acquisition, not just phase acquisition. For example, BBPFD 101 may assert the FUP signal if the frequency of the FBCLK feedback clock signal is less than the frequency of the CLK1 input clock signal. As another example, BBPFD 101 may assert the FDN signal if the frequency of the FBCLK feedback clock signal is greater than the frequency of the CLK1 input clock signal.

For example, BBPFD 101 can assert the FUP signal when the phase of the FBCLK clock signal slips by more than $2\pi$ (i.e., 360°) behind the phase of the CLK1 clock signal. As another example, BBPFD 101 can assert the FDN signal when the phase of the FBCLK clock signal slips by more than $2\pi$ (i.e., 360°) ahead of the phase of the CLK1 clock signal.

Digital loop filter (DLF) 200 includes 5 shift-registers that provide an integrating function. FIR 302 and parallel FIR 303 each include a shift register. DLF 200 also includes fine shift register 308, medium shift register 309, and band shift register 310. Shift registers 308-310 are carry/borrow-based "odometer-like" registers that allow both fine and coarse frequency control of DCO 103 in a slow, integrator-like fashion. The basic operation of shift registers 308, 309, and 310 is described above with respect to shift register 204 in FIG. 2.

Each of the shift registers 308-310 stores one bits and zero bits in a set of serially coupled flip-flops. The one bits are stored in sequence in each shift register, and the zero bits are stored in sequence in each shift register. The one bits and zero bits stored in shift registers 308-310 control switches that are coupled to capacitors in DCO 103. Each one bit stored in shift registers 308-310 closes a switch (or group of switches). When a switch is closed, an additional capacitor is coupled to a node in DCO 103, causing the frequency of output clock signal OUT to decrease. Each zero bit stored in shift registers 308-310 opens a switch (or group of switches). When a switch is opened, an additional capacitor is decoupled from a node in DCO 103, causing the frequency of output clock signal OUT to increase.

The one bits and zero bits stored in fine shift register 308 are routed to DCO 103 in parallel along the FCON<63:0> signal bus. The one bits and zero bits stored in medium shift register 309 are routed to DCO 103 in parallel along the MEDIUM<15:0> signal bus. The one bits and zero bits stored in band shift register 310 are routed to DCO 103 in parallel along the BAND<39:0> signal bus. In the example of FIG. 3, register 308 stores 64 bits, and the FCON<63:0> signal bus routes these 64 bits from register 308 to DCO 103. Also in the example of FIG. 3, register 309 stores 16 bits, and the MEDIUM<15:0> signal bus routes these 16 bits from register 309 to DCO 103. Further, in the example of FIG. 3, register 310 stores 40 bits, and the BAND<39:0> signal bus routes these 40 bits from register 310 to DCO 103. These specific numbers are provided for the purpose of illustration and are not intended to limit the scope of the present invention. Shift registers 308-310 can be designed to store any suitable number of bits.

Bubble detect blocks 311-313 are coupled to the output terminals of shift registers 308-310, respectively. Bubble detect blocks 311-313 check for non-monotonicity in the thermometer coded bits stored in shift registers 308-310 that are routed through the signal buses FCON, MEDIUM, and BAND, respectively. Bubble detect blocks 311-313 assert signals Bubble 2, Bubble 1, and Bubble 0, respectively, when they detect a non-monotonicity in the bits stored in their respective shift registers 308-310. For example, if bubble detect block 311 detects a non-monotonicity in the bits stored in fine shift register 308, bubble detect block 311 asserts the Bubble 2 signal. A non-monotonicity can be, for example, one or more zero bits stored between a set of one bits (e.g., 111101111) in one of the shift registers 308-310. A non-monotonicity can also be one or more one bits stored between a set of zero bits (e.g., 000010000) in one of the shift registers 308-310. Thus, a non-monotonicity can be an out-of-sequence one bit or an out-of-sequence zero bit. If one of the bubble detectors 311-313 detects a non-monotonicity and asserts one of the Bubble signals, PLL 100 can reset the counters, or alternatively, PLL 100 may perform no additional function in response to the Bubble signal.

In order to control the filter bandwidth, quantization noise, and integral path gain, DLF 200 has a frequency divider 304 that allows the process of decimation to take place, which is responsible for helping to set the PLL bandwidth. Divider 304 can also reduce power consumption, but the focus of the divider 304 is to set PLL bandwidth. Frequency divider 304 divides the frequency of clock signal DR to generate a frequency divided output clock signal Clock Enable. The Clock Enable signal is transmitted to input terminals of shift registers 308-310 and latches 305-306. The Clock Enable signal clocks shift registers 308-310. Frequency divider 304 also slows down the integration process (i.e., reduces the bandwidth when the decimated Clock Enable signal is used to drive fine shift register 308). Frequency divider 304 provides several different modes of operation that can effectively reduce the update rate of the integral paths of shift registers 308-310.

The frequency of signal DR divided by the frequency of the Clock Enable signal equals a frequency division value N. The frequency of the Clock Enable signal is smaller than the frequency of the DR signal if N is greater than 1. The frequency division value N can, for example, be set to an integer value in the range of 1-31. By reducing the rate at which the integral paths can change, the maximum slew rate of the integration, and therefore gain, is effectively reduced. Therefore the fine, medium and band integrators controlled by registers 308-310 are updated at the end of each updating period. The updating period can be, for example, after every N clock cycles in the DR signal, where N is the frequency division value of frequency divider 304.

The frequency division value applied by frequency divider 304 to signal DR is programmable. Frequency division is also referred to herein as decimation. Other blocks in DLF 200 can also be programmable to increase the versatility of the design. For example, blocks 301, 302, 303, 307, and 311-313 can be programmable.

Parallel FIR (PFIR) filter 303 is a programmable shift register that contains a set of serially coupled flip-flops. The maximum number of bits that can be stored in PFIR filter 303 is a programmable value. The maximum number of bits that can be stored in filter 303 is referred to as the length of filter 303. Programmable bits determine the programmable length of filter 303.

PFIR filter 303 generates UP and DN output signals in response to the SIGN and DR input signals from BBPFD 101. The UP and DN output signals are transmitted to input terminals of PPA control block 307 and to input terminals of fine shift register 308.

PFIR filter 303 is designed to provide integral control during the decimation mode, which takes into account the polarity of the SIGN signal over several reference clock cycles. The shift register in PFIR filter 303 is clocked by the DR signal. For example, PFIR filter 303 may shift an additional one bit (i.e., a logic high state) into its shift register when the SIGN signal is in a logic low state during a cycle (i.e., period) of the DR signal. Using a more specific example, if the SIGN signal is in a logic low state over 5 cycles of the DR signal, then 5 one bits are serially shifted into 5 flip-flops in the shift register in filter 303. As another example, PFIR filter 303 shifts an additional zero bit (i.e., a logic low state) into its shift register when the SIGN signal is in a logic high state during a cycle of the DR signal. Using a more specific example, if the SIGN signal is in a logic high state over 3 cycles of the DR signal, then 3 zero bits are serially shifted into 3 flip-flops in the shift register in filter 303.

The logic states of the UP and DN signals from PFIR filter 303 are set based on the number of one bits and the number of zero bits stored in the shift register in filter 303. The number of one bits and zero bits stored in the shift register in filter 303 is based on the density of the SIGN signal. This technique is referred to as majority vote functionality.

PFIR filter 303 has two settable thresholds. The upper threshold determines when the UP signal is asserted, and the lower threshold determines when the DN signal is asserted. These two thresholds are set through two 5-bit binary programmable control signals.

An example of the operation of registers 308-310 is now described using the assumption that all of the bits stored in registers 308-310 are initially zero (i.e., in logic low states). If the density of one bits (i.e., bits in logic high states) stored in PFIR filter 303 is equal to or greater than the upper threshold, PFIR filter 303 asserts the UP signal (e.g., generates a logic high state in the UP signal). When the UP signal is asserted, an additional one bit is serially shifted into fine shift register 308 in each clock period of the Clock Enable signal, as described with respect to shift register 204. The number of one bits (i.e., bits in logic high states) stored in fine shift register 308 increases, and the number of zero bits (i.e., bits in logic low states) stored in fine shift register 308 decreases during each period of Clock Enable that the UP signal is asserted. When the number of one bits stored in fine shift register 308 increases, and the number of zero bits stored in fine shift register 308 decreases, the capacitance at a node in DCO 103 increases, causing the phases and the frequencies of the output clock signal OUT and the feedback signal FBCLK to decrease (i.e., logic state transitions occur later in time), as discussed with respect to FIG. 2. The one bits and zero bits stored in the flip-flops in shift register 308 are transmitted from bubble detect block 311 to DCO 103 along bus FCON<63:0>.

If the UP signal continues to be asserted, more one bits are serially shifted into register 308. If the UP signal continues to be asserted after 64 one bits have been serially shifted into fine shift register 308, 31 bits in fine shift register 308 are reset to zero bits, and fine shift register 308 asserts the C1 carry signal. Asserting the C1 signal causes a one bit to be serially shifted into medium shift register 309. If the UP signal continues to be asserted, then one bits continue to be serially shifted into register 308. After 64 one bits have been stored in register 308 a second time, the C1 signal is asserted again, register 308 resets 31 of its stored bits to zero bits, and an additional one bit is serially shifted into register 309. If the UP signal continues to be asserted, this process repeats, until 16 one bits have been serially shifted into register 309.

When 16 one bits have been serially shifted into medium shift register 309, and the UP is asserted, medium shift register 309 resets its flip-flops to predefined logic states, and medium shift register 309 asserts the C2 carry signal. In response to the C2 signal being asserted, a one bit is serially shifted into band shift register 310. If the UP signal continues to be asserted, this process repeats until 40 one bits have been serially shifted into register 310.

Another example of the operation of registers 308-310 is now described using the assumption that all of the bits stored in registers 308-310 are initially one (i.e., in logic high states). If the density of zero bits stored in PFIR filter 303 is greater than or equal to the lower threshold, PFIR filter 303 asserts the DN signal (e.g., generates a logic high state in the DN signal). When the DN signal is asserted, an additional zero bit is serially shifted into fine shift register 308 in each clock period of the Clock Enable signal. The number of one bits stored in fine shift register 308 decreases, and the number of zero bits stored in fine shift register 308 increases during each period of Clock Enable that the DN signal is asserted. When the number of one bits stored in fine shift register 308 decreases, and the number of zero bits stored in fine shift register 308 increases, the capacitance at the node in DCO 103 decreases, causing the phases and the frequencies of the output clock signal OUT and the feedback signal FBCLK to increase (i.e., logic state transitions occur earlier in time), as discussed with respect to FIG. 2. Because the Clock Enable signal is frequency divided with respect to the DR signal, the Clock Enable signal slows down the averaging process and the integration process in registers 308-310, which reduces the bandwidth of PLL 100.

If the DN signal continues to be asserted, more zero bits are serially shifted into fine shift register 308. If the DN signal continues to be asserted after 64 zero bits have been serially shifted into fine shift register 308, 31 bits in fine shift register 308 are reset to one bits, and fine shift register 308 asserts the B1 borrow signal. In response to the B1 signal being asserted, a zero bit is serially shifted into medium shift register 309. If the DN signal continues to be asserted, then zero bits continue to be serially shifted into register 308. After 64 zero bits have been stored in register 308 a second time, the B1 signal is asserted again, register 308 resets 31 of its stored bits to one bits, and an additional zero bit is serially shifted into register 309. If the DN signal continues to be asserted, this process repeats, until 16 zero bits have been serially shifted into register 309.

When 16 zero bits have been serially shifted into medium shift register 309, and the DN signal is asserted, medium shift register 309 resets its flip-flops to predefined logic states, and medium shift register 309 asserts the B2 borrow signal. In response to the B2 signal being asserted, a zero bit is serially shifted into band shift register 310. If the DN signal continues to be asserted, this process repeats, until 40 zero bits have been serially shifted into register 310.

According to one particular embodiment, the Fine bits stored in register 308 drive the output clock signal OUT in frequency steps that each equal a frequency F1, the medium bits stored in register 309 drive clock signal OUT in frequency steps that each equal a frequency F2, and the band bits stored in register 310 drive clock signal OUT in frequency steps that each equal a frequency F3.

When DCO 103 receives a change in a single bit in the Fine bits stored in register 308, the capacitors in DCO 103 that are coupled to switches controlled by the Fine bits stored in register 308 cause a frequency change of F1 in output clock signal OUT. When DCO 103 receives a change in a single bit in the Medium bits stored in register 309, the capacitors in DCO 103 that are coupled to switches controlled by the Medium bits stored in register 309 cause a frequency change of F2 in output clock signal OUT. The frequency change F2 in OUT caused by a change in one bit stored in medium shift register 309 equals the frequency change in OUT caused by changing 32 bits stored in fine shift register 308 (i.e., F2=32× F1).

When DCO 103 receives a change in a single bit in the Band bits stored in register 310, the capacitors in DCO 103 that are coupled to switches controlled by the Band bits stored in register 310 cause a frequency change of F3 in output clock signal OUT. The frequency change F3 in OUT caused by a change in one bit stored in band shift register 310 equals the frequency change in OUT caused by changing all of the bits stored in medium shifter register 309 (i.e., F3=16×F2). The particular frequency steps F1, F2, and F3 selected are tied to the implementation of the DCO.

Latch 305 stores the logic states of the L1UP and L1DN signals received from BBPFD 101. Latch 305 provides the ability to capture events in the L1UP/L1DN signals to ensure that the events are acted upon at the end of the decimation cycle. Latch 305 transmits pulses in the L1UP and L1DN signals to medium shift register 309. Latch 305 is clocked by the Clock Enable signal. Each modification to the number of one and zero bits stored in medium shift register 309 aids in phase acquisition between the CLK1 and FBCLK signals.

BBPFD 101 asserts one of the L1UP and L1DN signals when the magnitude of the phase difference between CLK1 and FBCLK is larger than the preset phase threshold. In response to the L1UP signal being asserted, an additional zero bit is serially shifted into medium shift register 309. In response to the L1DN signal being asserted, an additional one bit is serially shifted into medium shift register 309.

Latch 306 stores the logic states of the FUP and FDN signals received from BBPFD 101. Latch 306 provides the ability to capture events in the FUP/FDN signals to ensure that the events are acted upon at the end of the decimation cycle. Latch 306 transmits pulses in the FUP and FDN signals to band shift register 310 in response to the Clock Enable signal. The Clock Enable signal is also routed to register 310.

The FUP and FDN signals are generated to help frequency acquisition between CLK1 and FBCLK when their frequencies are too far apart. BBPFD 101 asserts one of the FUP and FDN signals when the magnitude of the frequency difference between CLK1 and FBCLK is larger than the preset frequency threshold. After the FUP signal is asserted, an additional zero bit is serially shifted into band shift register 310. After the FDN signal is asserted, an additional one bit is serially shifted into band shift register 310. The capacitor bank sizes controlled by band shift register 310 are used to assure a large enough DCO frequency range can be applied to the DCO for DCO process, supply voltage, and temperature spreads for manufacturability.

Figure 4:
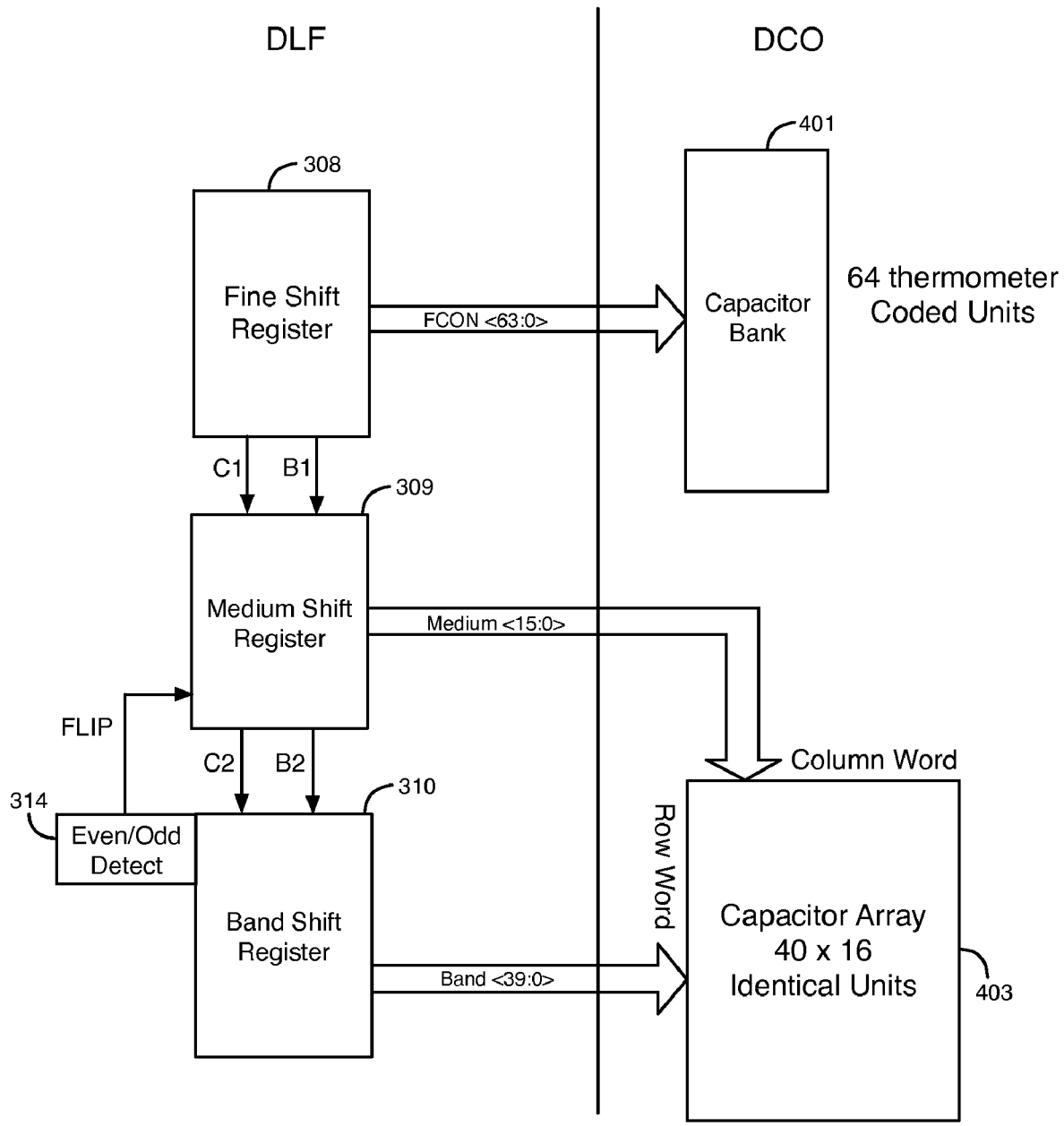
FIG. 4 illustrates capacitor banks in the DCO that are controlled by the fine, medium, and band shift registers, according to an embodiment of the present invention.

FIG. 4 illustrates capacitor banks in the DCO that are controlled by the fine, medium, and band shift registers, according to an embodiment of the present invention. In one embodiment, fine shift register 308 can store up to 64 bits of memory. The 64 bits in fine shift register 308 control 64 switches coupled to 64 capacitors in bank 401 in DCO 103. Each of the capacitors has the same capacitance. Each of the switches may be coupled to a common node. The frequency of the OUT clock signal varies in response to the capacitance at that common node.

A change in the logic states of all 64 bits in register 308 causes a total frequency change of 64×F1 in output clock signal OUT. F1 is the frequency step in OUT caused by changing one bit stored in register 308. In one embodiment, medium shift register 309 stores up to 16 bits. In this embodiment, F2=32×F1. F2 is the frequency step in OUT caused by changing one bit stored in register 309. Changing the logic states of all 16 bits stored in register 309 causes a total frequency change of 16×F2 in the frequency of OUT. In one embodiment, band shift register 310 stores up to 40 bits. In this embodiment, F3=16×F2. F3 is the change in the frequency of OUT caused by changing the logic state of one bit stored in band shift register 310. Changing the logic states of all 40 bits stored in register 310 causes a total frequency change of 40×F3 in the frequency of OUT.

The fine shift register 308 stores double the number of bits (e.g., 64 bits) than it needs to cause the same change in the frequency of the OUT clock signal that is caused by changing the logic state of one bit stored in medium shift register 309. By making register 308 large enough to store double the number of bits than needed to cause the same change in the frequency of OUT by changing one bit in register 309, in-and-out transitions are avoided in medium shift register 309 should the frequency of PLL 100 be on the edge of the transition, e.g., between fine shift register 308 being full of 64 one bits and storing the first one bit in medium shift register 309. If register 308 is only large enough to store 32 bits, when a rollover to storing bits in register 309 takes place (i.e., register 308 asserts the carry or borrow signals C1 or B1), any mismatch may cause transition jitter. By making register 308 large enough to store 64 bits instead of 32 bits, the chances of generating significant transition jitter caused by any frequency mismatch is reduced.

Shift registers 309 and 310 control a capacitor array 403 in DCO 103. Capacitor array 403 contains 640 capacitors that are arranged into 16 columns and 40 rows. Each of the 16 columns contains 40 capacitors. Each of the 40 rows contains 16 capacitors. Each capacitor may have the same capacitance or a different capacitance. Each capacitor is coupled to a switch. Each of the switches may be coupled to a common node. The frequency of the OUT clock signal varies in response to the capacitance at the common node. A 40×16 capacitor array 403 is described herein as an example for the purpose of illustration. Registers 309-310 can control any suitable number of capacitors.

The bits stored in medium shift register 309 control switches that are coupled to a row of the capacitors in array 403. The bits stored in band shift register 310 determine the row of capacitors in array 403 that is being controlled by the bits in medium shift register 309. Shifting an additional one bit into band shift register 310 causes the bits stored in medium shift register 309 to control the capacitors in the next consecutive row in array 403. Shifting an additional zero bit into band shift register 310 causes the bits stored in medium shift register 309 to control the capacitors in the previous row in array 403.

An example of the operation of medium and band shift registers 309-310 is now described for the purpose of illustration. This example is not intended to limit the scope of the present invention. According to this particular example, the switches coupled to the capacitors in the even numbered rows of array 403 (i.e., row 2, row 4, row 6, etc.) close in response to zero bits from medium shift register 309 and open in response to one bits from medium shift register 309. In this example, the switches coupled to the capacitors in the odd numbered rows of array 403 (i.e., row 1, row 3, row 5, etc.) open in response to zero bits from medium shift register 309 and close in response to one bits from medium shift register 309.

Further details of the operation of array 403 are now described according to this particular example. After 16 one bits have been stored in register 309 in response to the UP signal being asserted, the switches coupled to all 16 capacitors in row 1 of array 403 are closed. If the UP signal continues to be asserted, register 309 asserts the C2 signal, causing a one bit to be serially shifted into register 310. Even/odd detector 314 then asserts a FLIP signal, which causes register 309 to reset only one of its stored one bits to a zero bit.

Register 310 then causes the bits stored in register 309 to control the switches coupled to the capacitors in row 2 of array 403.

Zero bits are then serially shifted into register 309 in response to the UP signal continuing to be asserted, instead of one bits. After 16 zero bits have been stored in register 309, the switches coupled to all 16 capacitors in row 2 of array 403 are closed. If the UP signal continues to be asserted, register 309 asserts the C2 signal again, causing another one bit to be serially shifted into register 310. Even/odd detector 314 then asserts the FLIP signal again, which causes register 309 to reset only one of its stored zero bits to a one bit. Register 310 then causes the bits stored in register 309 to control the switches coupled to the capacitors in row 3 of array 403. One bits are then serially shifted into register 309 in response to the UP signal continuing to be asserted, instead of zero bits. This process repeats for each additional row of array 403 as long as the UP signal continues to be asserted.

The reverse process occurs when the DN signal is asserted. Each time that medium shift register 309 asserts the B2 signal, even/odd detector 314 asserts the FLIP signal, causing only one of the bits stored in register 309 to flip to its opposite logic state. In response to the DN signal continuing to be asserted, zero bits are serially shifted into register 309 to open switches that are coupled to capacitors in an odd row of array 403, and one bits are serially shifted into register 309 to open switches that are coupled to capacitors in an even row of array 403.

DLF 200 also includes a serial FIR filter 302 that always operates at the full clock rate speed to provide at-rate (i.e., undecimated) corrections, if necessary. FIR filter 302 can generate small changes to the phase and frequency of the output clock signal OUT and the feedback clock signal FBCLK in response to a phase difference between FBCLK and CLK1. FIR filter 302 affects changes in the phase and frequency of OUT and FBCLK by changing the number of capacitors that are coupled to a common node in DCO 103.

FIR filter 302 can be, for example, the smallest size integral control path in DLF 200. FIR filter 302 can, for example, drive programmable multiples of a frequency step in the output clock signal OUT of DCO 103 by generating signals that are routed through the SFCON<15:0> signal bus. FIR filter 302 includes a shift register that stores up to 16-bits. FIR filter 302 can provide a running history of past bits in the SIGN signal. The bits stored in the shift register in FIR filter 302 and routed through the SFCON<15:0> signal bus control the states of switches in DCO 103 that are coupled to capacitors, as described above with respect to FIG. 2. Programming signals determine the maximum number of bits that can be stored in FIR filter 302 (i.e., the length of filter 302).

PPX block 301 is the associated proportional path for FIR filter block 302. FIR filter 302 is essentially an integrator, and an accompanying PPX block 301 is needed to maintain its stability. PPX block 301 is an independently programmable part, which can be completely deactivated. PPX block 301 provides a proportional path function to the control system of FIG. 3 to maintain stability. PPX block 301 generates 8 mathematically differentiated (as opposed to integrated) signals that are routed through the PPX<7:0> bus to DCO 103. PPX block 301 generates an additional one bit or an additional zero bit on the PPX<7:0> bus whenever the SIGN signal changes its logic state. Each bit on the PPX<7:0> bus can, e.g., cause a change in the frequency of the output clock signal OUT that is half the change in the frequency of OUT caused by a change in a single bit in register 308.

Figure 5A:
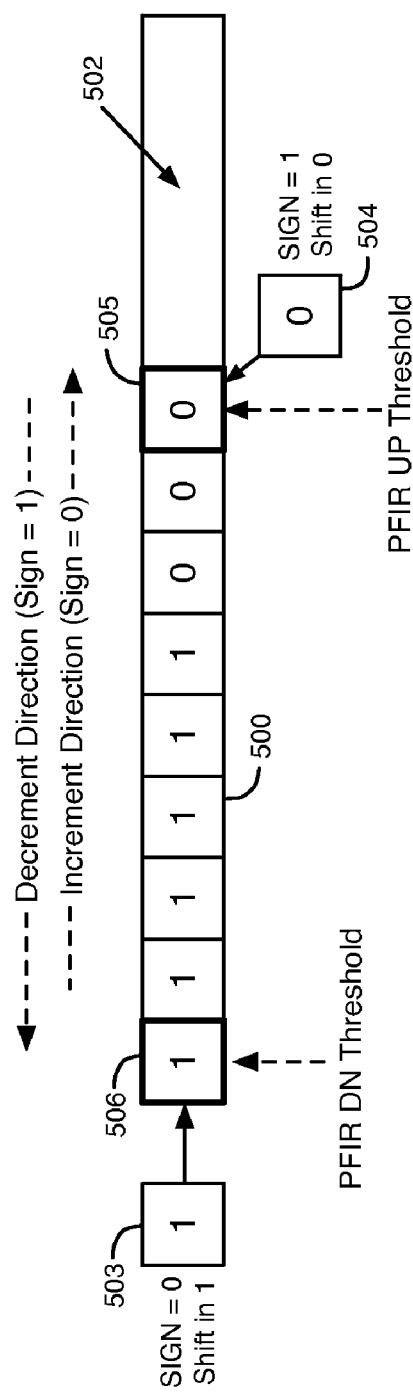
FIG. 5A illustrates an example of the PFIR filter in the DLF of FIG. 3, according to an embodiment of the present invention.

FIG. 5A illustrates an example of PFIR filter 303 in DLF 200, according to an embodiment of the present invention.

Shift register 500 shown in FIG. 5A is an example of PFIR filter 303 in DLF 200. In the example of FIG. 5A, the length of the shift register 500 is set at 9 bits. Thus, register 500 can store up to 9 bits of information. In the example of FIG. 5A, the 9 bits stored in the first 9 flip-flops of shift register 500 are shown as 111111000 for the purpose of illustration. The rest of shift register 500 (i.e., region 502) is deactivated. Region 502 does not store information bits, until its flip-flops are activated.

The length of shift register 500 is programmable. Region 502 contains extra flip-flops that can be activated to increase the length of shift register 500 so that the maximum number of bits register 500 is able to store increases (e.g., 10 bits, 11 bits, 12 bits, etc.). The length of shift register 500 can also be decreased by deactivating one or more additional flip-flops in register 500 so that the maximum number of bits register 500 can store decreases (e.g., 8 bits, 7 bits, 6 bits, etc.). The logic states of programming signals received at PFIR filter 303 determine the programmable length of register 500.

Shift register 500 receives the SIGN signal from BBPFD 101 as shown in FIG. 3 with respect to PFIR filter 303. A 1 bit from box 503 is shifted into register 500 in response to receiving a zero bit (i.e., a logic low state) in the SIGN signal. A 0 bit from box 504 is shifted into register 500 in response to receiving a one bit (i.e., a logic high state) in the SIGN signal. In register 500, the one bits are stored sequentially, and the zero bits are stored sequentially.

Each time that register 500 captures a zero bit in the SIGN signal, a one bit is shifted into flip-flop 506 in register 500, and each of the other bits stored in shift register 500 are serially shifted by one bit to the right (increment direction) with respect to the orientation of shift register 500 in FIG. 5A. Flip-flop 505 represents the programmable UP threshold location in register 500. When the leading one stored in register 500 is shifted into flip-flop 505, the UP signal is activated.

Each time that register 500 captures a one bit in the SIGN signal, a zero bit is shifted into flip-flop 505 in register 500, and each of the other bits stored in shift register 500 are serially shifted by one bit to the left (decrement direction) with respect to the orientation of shift register 500 in FIG. 5A. Flip-flop 506 represents the programmable DN threshold location in register 500. When the leading zero stored in register 500 is shifted into flip-flop 506, the DN signal is activated.

The UP and DN thresholds of register 500 are programmable. The UP and DN thresholds can be moved to storage locations in register 500 other than flip-flops 505-506. Only one bits are shifted into register 500 from the left side in response to a captured zero bit in the SIGN signal, and only zero bits are shifted into register 500 from the right side in response to a captured one bit in the SIGN signal.

The bit length of PFIR filter 303 can be set to be equal to the frequency division value of divider 304, which determines the decimation period. When the bit length of PFIR filter 303 is not equal to the frequency division value of divider 304, PFIR filter 303 averages the SIGN bits over a different period than the update cycle (as defined by the decimation period). This averaging period can be longer or shorter than the decimation period depending on the desired behavior.

In the embodiment of FIG. 5A, the UP and DN thresholds are set to the end points of the PFIR filter shift register 303/500. Therefore, fine shift register 308 is only changed if the bits stored in register 500 are all zero bits or all one bits (i.e., full or empty) during the N cycles of decimation. This architecture achieves an integration path gain of approximately 1/N. PFIR filter 303 always operates at the full clock rate of the DR signal and acts according to the SIGN signal bit as the SIGN signal bit appears at the input of PFIR filter 303 in every clock cycle, while the output signals UP and DN are also available every single clock cycle.

Figure 5B:
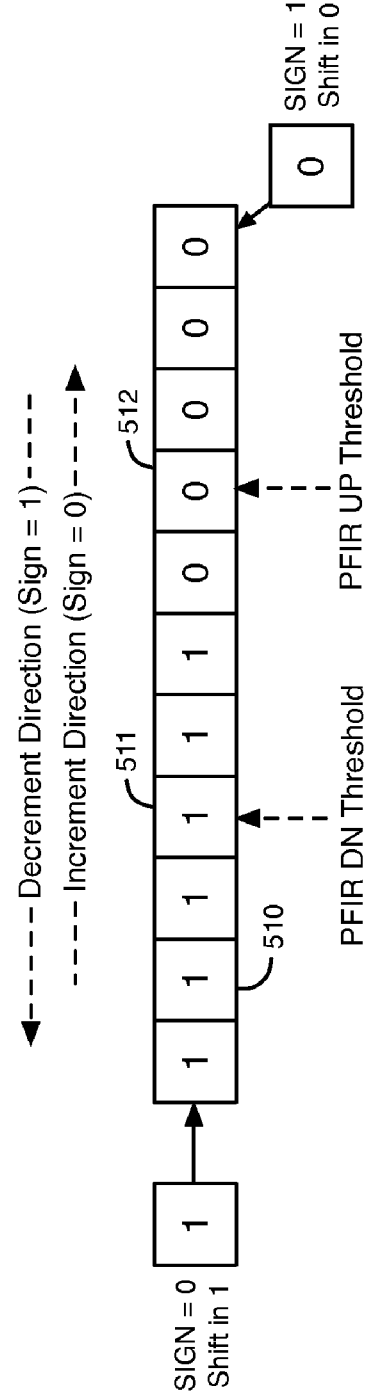
FIG. 5B illustrates another example of the PFIR filter in the DLF of FIG. 3, according to an embodiment of the present invention.

FIG. 5B illustrates another example of PFIR filter 303 in DLF 200, according to an embodiment of the present invention. Shift register 510 shown in FIG. 5B is an example of PFIR filter 303 in DLF 200. In the example of FIG. 5B, the length of the shift register 510 is 11 bits. Thus, shift register 510 can store up to 11 bits of information. In the example of FIG. 5B, the 11 bits stored in the 11 flip-flops of shift register 510 are shown as 11111100000 for the purpose of illustration. The length of shift register 510 is programmable and can be set to another value other than 11 bits.

In shift register 510, the UP and DN thresholds are programmable. Thus, the UP and/or DN thresholds can be moved away from the end points of shift register 510. The programmable UP and DN thresholds can provide behavior that is similar to programmable hysteresis. The contents of shift register 510 have the ability to increment beyond the UP or DN threshold. Therefore, the UP and DN output signals of shift register 510 may take several cycles to reflect a reversal in the polarity of the SIGN signal and possibly (depending on the divider 304 settings) may continue to make changes to the integral paths that are opposite to the instantaneous polarity of the SIGN signal.

An example of this quasi-hysteresis mode of operation is illustrated in FIG. 5B. FIG. 5B illustrates UP and DN threshold settings that are not at the end-points of the PFIR filter shift register 510 as it is configured. The DN threshold is located in flip-flop 511, and the UP threshold is located in flip-flop 512.

In PFIR filter shift register 510, the UP output signal is activated when the leading one bit reaches the UP threshold (flip-flop 512), and the DN signal is activated when the leading zero bit reaches the DN threshold (flip-flop 511). The leading one bit in register 510 can be shifted beyond the UP threshold location, and the leading zero bit in register 510 can be shifted beyond the DN threshold, which mimics the behavior of hysteresis. Although the UP and DN thresholds do not dynamically change as in the hysteresis effect, the UP and DN output signals of PFIR filter shift register 510 do not immediately reflect a polarity change in the SIGN signal bit. Also, the UP and DN output signals of shift register 500 do not immediately reflect a polarity change in the SIGN signal bit.

PPA control block 307 provides a proportional path function to the control system of FIG. 3. As shown in FIG. 3, PPA control block 307 generates 8 signals that are routed through the PPA<7:0> signal bus to DCO 103. Each additional one or zero bit routed through the PPA<7:0> bus causes a much larger change in the frequency of the output clock signal than caused by a single bit change in register 308. PPA control block 307 adjusts the logic states of the signals routed through the PPA<7:0> bus in response to changes in the UP, DN, SIGN, and DR signals. In general, depending on the mode of operation, PPA control block 307 adjusts the logic states of the signals on the PPA<7:0> bus when fine shift register 308 changes the logic states of the signals routed on the FCON<63:0> bus. The changes that PPA control block 307 cause in the frequency of output clock signal OUT provide stability to the phase-locked loop. In general, the functions of PPA control block 307 are derived from actions performed by PFIR filter 303 and/or decimation-triggered integration.

A larger PPB proportional path is triggered when medium shift register 309 is incremented or decremented. Medium shift register 309 generates signals on bus PPB <1:0> that affect changes in the frequency of output clock signal OUT. There are no special PPB modes of operation.

The gain of PPA control block 307 is set by multiples of a frequency step F0. PPA control block 307 generates 2 programmable output bits, rather than just 1 bit that is generated by other proportional paths. The 2 programmable output bits account for any tri-state occurrences when no integration is taking place, e.g., during decimation, as described below. PPA control block 307 has multiple different states that depend on the mode of operation.

When no decimation is taking place (un-decimated), PPA control block 307 generates output bits 00 to cause all of the PPA capacitors in the DCO to be decoupled from the common node, increasing the frequency and phase of output clock signal OUT. PPA control block 307 generates output bits of 11 to cause all of the PPA capacitors in the DCO to be coupled to the common node, decreasing the frequency and phase of the output clock signal OUT.

When decimation is taking place, PPA control block 307 may generate output bits 01, which causes one capacitor to be coupled to the common node in the DCO and one capacitor to be decoupled from the common node in the DCO. No integration is taking place (i.e., nothing causing fine shift register 308 to increment or decrement), and thus no change occurs in the frequency or phase of output clock signal OUT. When a change is required in the frequency or phase of output clock signal OUT, only one PPA output bit needs to be changed.

When decimation is taking place, PPA control block 307 generates output bits 00 to cause all of the PPA capacitors in the DCO to be decoupled from the common node, increasing the frequency and phase of output clock signal OUT. Also, when decimation is taking place, PPA control block 307 generates output bits of 11 to cause all of the PPA capacitors in the DCO to be coupled to the common node, decreasing the frequency and phase of the output clock signal OUT.

PPA control block 307 is independently programmable using programming signals. PPA control block 307 can be responsive to the SIGN signal directly, or to the UP and DN output signals of PFIR filter 303.

PPA control block 307 has a bypass mode that allows the output signals of PPA control block 307 to be controlled directly by the incoming SIGN signal bit, as opposed to the UP and DN output signals of the PFIR filter 303 path. Bypass mode allows the path of PPA control block 307 to operate at the full clock signal rate independent of the decimation and PFIR filter 303 settings.

PPA control block 307 also has a single bit mode that reduces the gain of PPA control block 307 from its normal 2-bit differential behavior, as described above, to a single bit. In this mode, the output signal of PPA control block 307 is directly reflecting the direction of the Fine integration performed by register 308 with the output bits equal to one for incrementing or zero for decrementing. Because there is no ability to create a third state from one bit, there is no tri-state (i.e., do-nothing state) used in the single bit mode. The single bit mode does not preclude the use of the programmable size of the PPA control block 307.

However, the single bit mode does reduce the programmable range of block 307 by half. Therefore, the two output states of PPA control block 307 in single bit mode and with the gain set to a maximum of 8 bits are represented as '11110000' or '00000000'. The single bit mode is preferably used when DLF 200 is in full clock rate operation, or when PPA control block 307 is set to bypass mode to ensure that the state of the PPA control block 307 output bits are continually updated in the appropriate direction.

PPA control block 307 also has a PPA hold mode feature. The PPA hold mode feature is only useful when the decimation is active. The PPA hold mode allows the PPA state to be held throughout the duration of the decimation cycle, as opposed to a single full-rate cycle. Therefore, using the example from above (a decimation of 8), the PPA state is: 11-11-11-11-11-11-11-11. This feature has the effect of significantly increasing the gain of the proportional A path by 8 times.

Figure 6A:
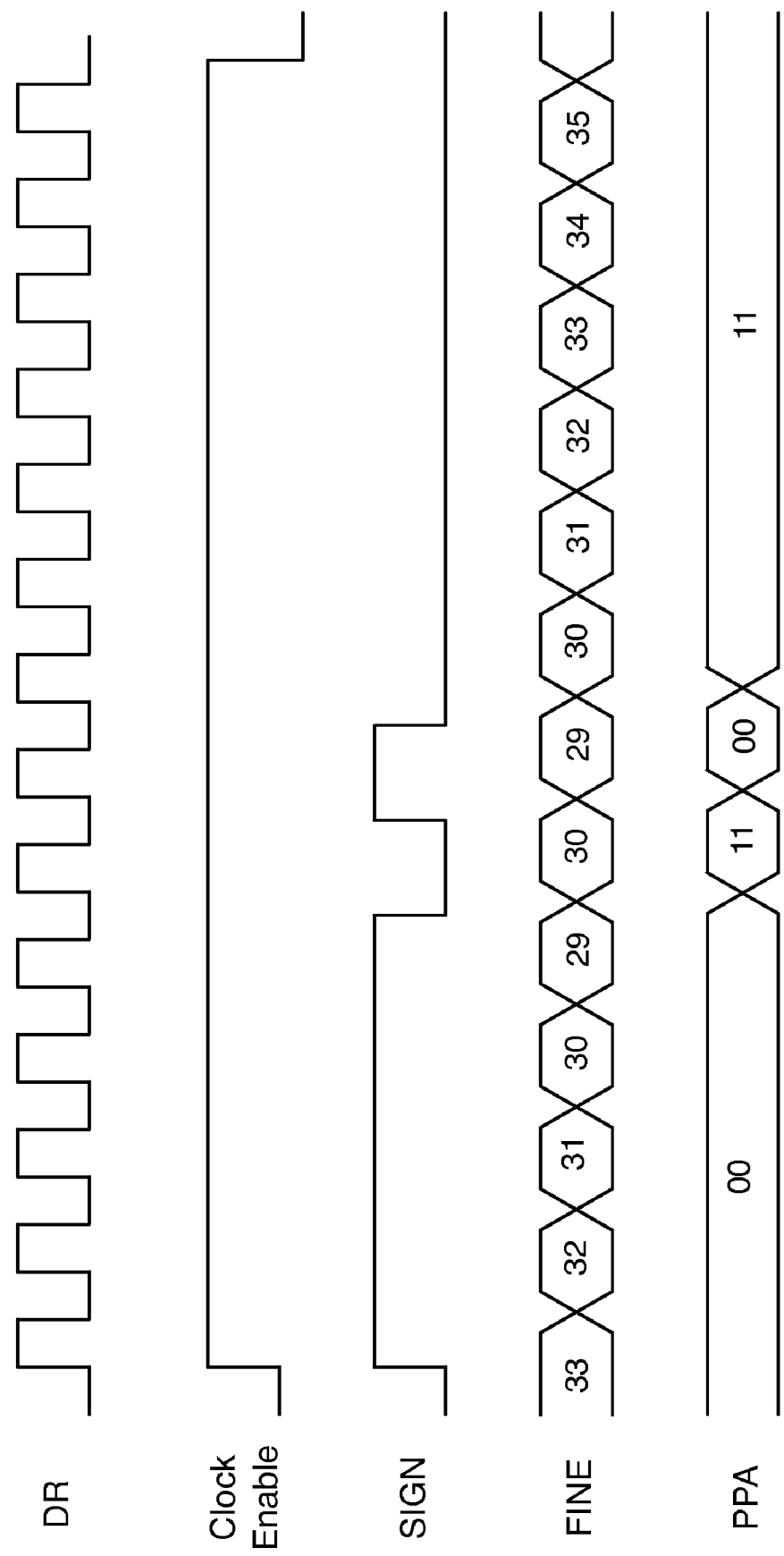
FIG. 6A is an undecimated timing diagram that illustrates example waveforms for various signals in the digital loop filter of FIG. 3, according to an embodiment of the present invention.

FIG. 6A is an undecimated timing diagram that illustrates example waveforms for various signals in digital loop filter 200, according to an embodiment of the present invention. DR is the data ready signal, which is also the reference frequency clock signal (e.g., CLK1). The Clock Enable signal is the output signal of the divider 304. If the divide ratio is one, the Clock Enable signal is always held high (active). The FINE signals represent the output signals of fine shift register 308 routed through bus FCON<63:0>. The PPA signals represent the 2-bit output signals of PPA control block 307. As shown in FIG. 6A, the SIGN signal bit is in a logic high state to start, which drives the FINE output signals of the fine shift register 308 integration to lower values. Every time a polarity switch occurs in the SIGN signal bit, a proportional path change accompanies it in the PPA signals and in the FINE output signals of register 308, because the Clock Enable signal is always high in this case.

Figure 6B:
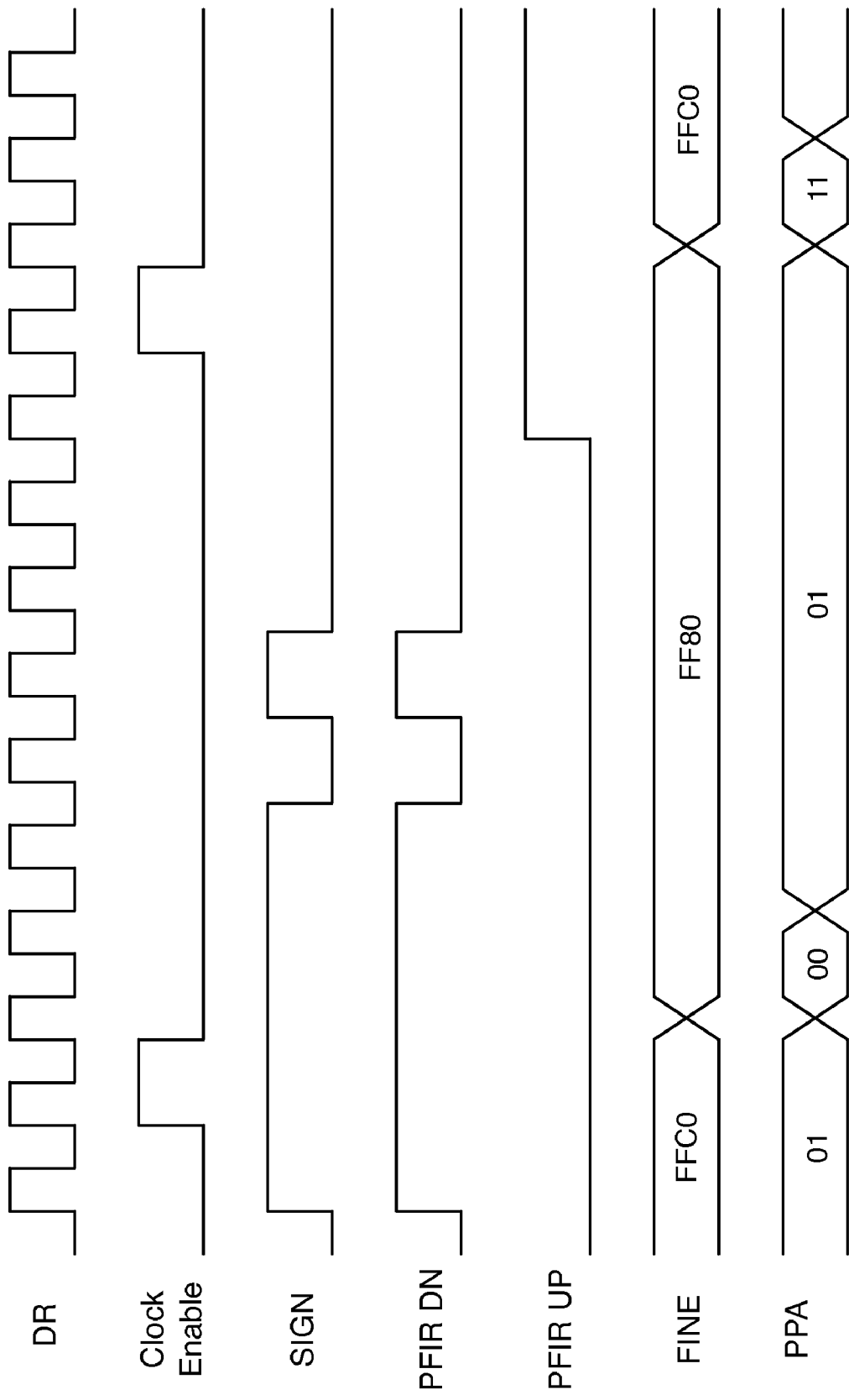
FIG. 6B is a decimated timing diagram that illustrates example waveforms for various signals in the DLF of FIG. 3, according to an embodiment of the present invention.

FIG. 6B is a decimated timing diagram that illustrates example waveforms for various signals in DLF 200, according to an embodiment of the present invention. FIG. 6B illustrates example waveforms for the UP and DN output signals of PFIR filter 303. PFIR filter 303 is involved in choosing the direction of integration. The FINE signals (shown in hexadecimal) generated by register 308 change once per decimation cycle, and the PPA signals have the no-change state of '01'. Also, the PPA signals are still reflecting a change in the FINE signals.

FIG. 6C is a decimated timing diagram that illustrates example waveforms for various signals in DLF 200, according to another embodiment of the present invention. FIG. 6C illustrates the full range of modes of operation (in terms of timing) for the decimated mode. Hold mode holds the PPA signals constant for the entire duration of the decimation cycle. Bypass mode triggers the PPA signals based on SIGN signal data, not the PFIR filter 303 output signals and the decimated divider Clock Enable signal. Single bit mode (which can be used with Bypass mode) disables one of the PPA control block's output bits, which effectively halves the gain of PPA control block 307.

Digital loop filter (DLF) 200 has several advantages. For example, the adder function present in many digital loop filters is not present in DLF 200. Instead, both the output of the proportional path and the output of the integration path are connected to DCO 103 separately. This configuration is possible, because DCO 103 has independent tuning units (i.e., capacitors).

As another example, the integrator (or an accumulator) step in many digital loop filters is normally small, especially in the locked condition. A shift register-based integrator in DLF 200 replaces a complex integrator. The output terminals of the shift registers 308-310 are connected to varactors in DCO 103. However, the shift registers limit the speed of frequency acquisition and the frequency tuning range.

To achieve a large frequency tuning range and maintain precise frequency control, multiple shift registers 308-310 (connected to different varactor banks in the DCO) are employed in DLF 200. To speed up the frequency acquisition process, these varactor banks can be controlled directly from the BBPFD 101 using, e.g., the L1UP and L1DN signals. In the specific example of FIG. 3, using the bang-bang phase frequency detector 101 to control the integral path requires additional FUP and FDN signals as acquisition aides in order to achieve frequency lock between CLK1 and FBCLK.

Various techniques of the present invention relating to digital loop filters can also be applied to digital loop filters in delay-locked loop circuits, particularly in digitally controlled delay-locked loop circuits.

Figure 7:
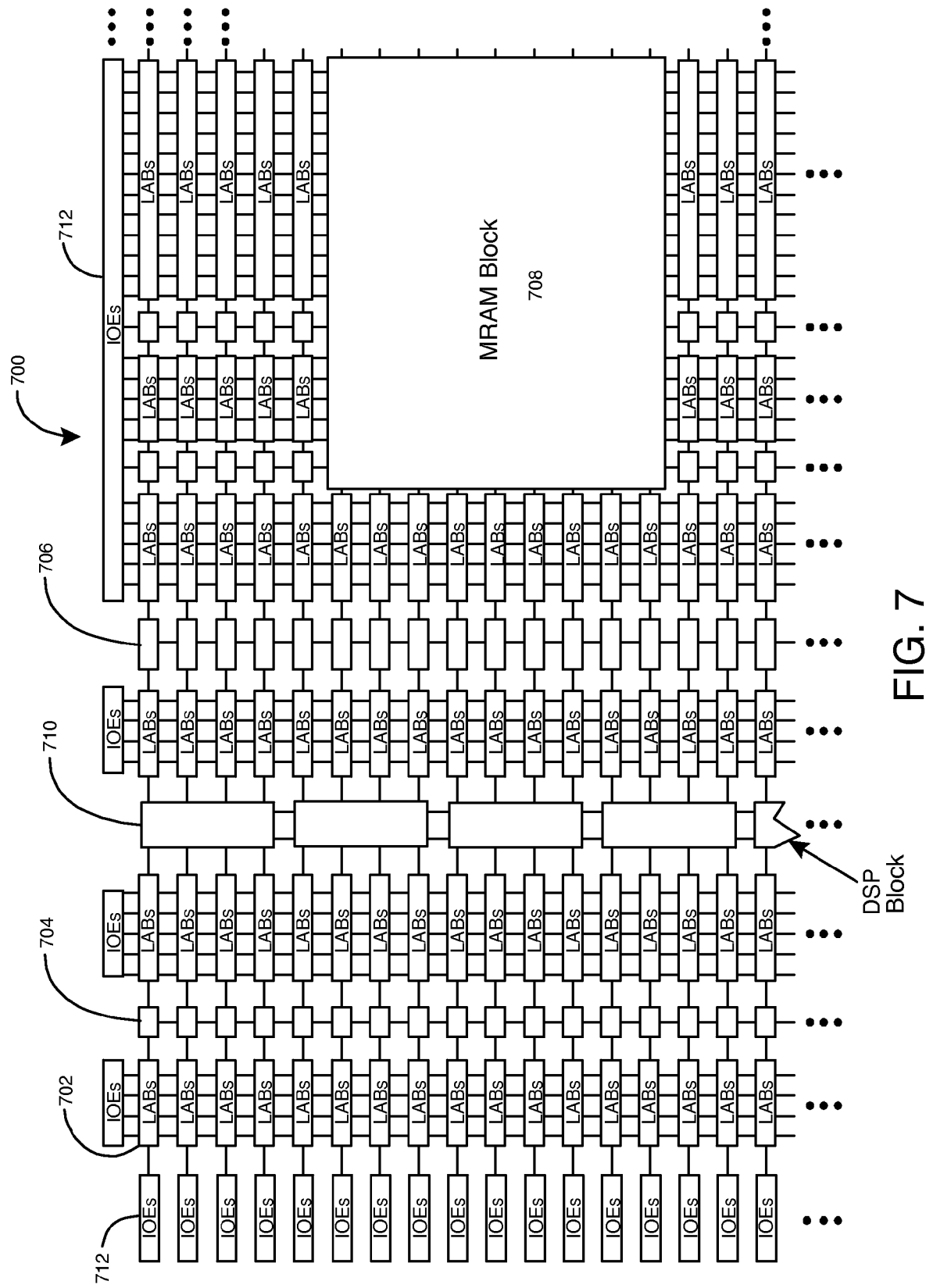
FIG. 7 is a simplified partial block diagram of a field programmable gate array (FPGA) that can include aspects of the present invention.

FIG. 7 is a simplified partial block diagram of a field programmable gate array (FPGA) 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including random access memory (RAM) blocks of varying sizes provided throughout the array. The RAM blocks include, for example, blocks 704, blocks 706, and block 708. These memory blocks can also include shift registers and first-in-first-out (FIFO) buffers.

FPGA 700 further includes digital signal processing (DSP) blocks 710 that can implement, for example, multipliers with add or subtract features. Input/output elements (IOEs) 712 located, in this example, around the periphery of the chip, support numerous single-ended and differential input/output standards. IOEs 712 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 700 is described herein for illustrative purposes only and that the present invention can be implemented in many different types of PLDs, FPGAs, and ASICs.

Figure 8:
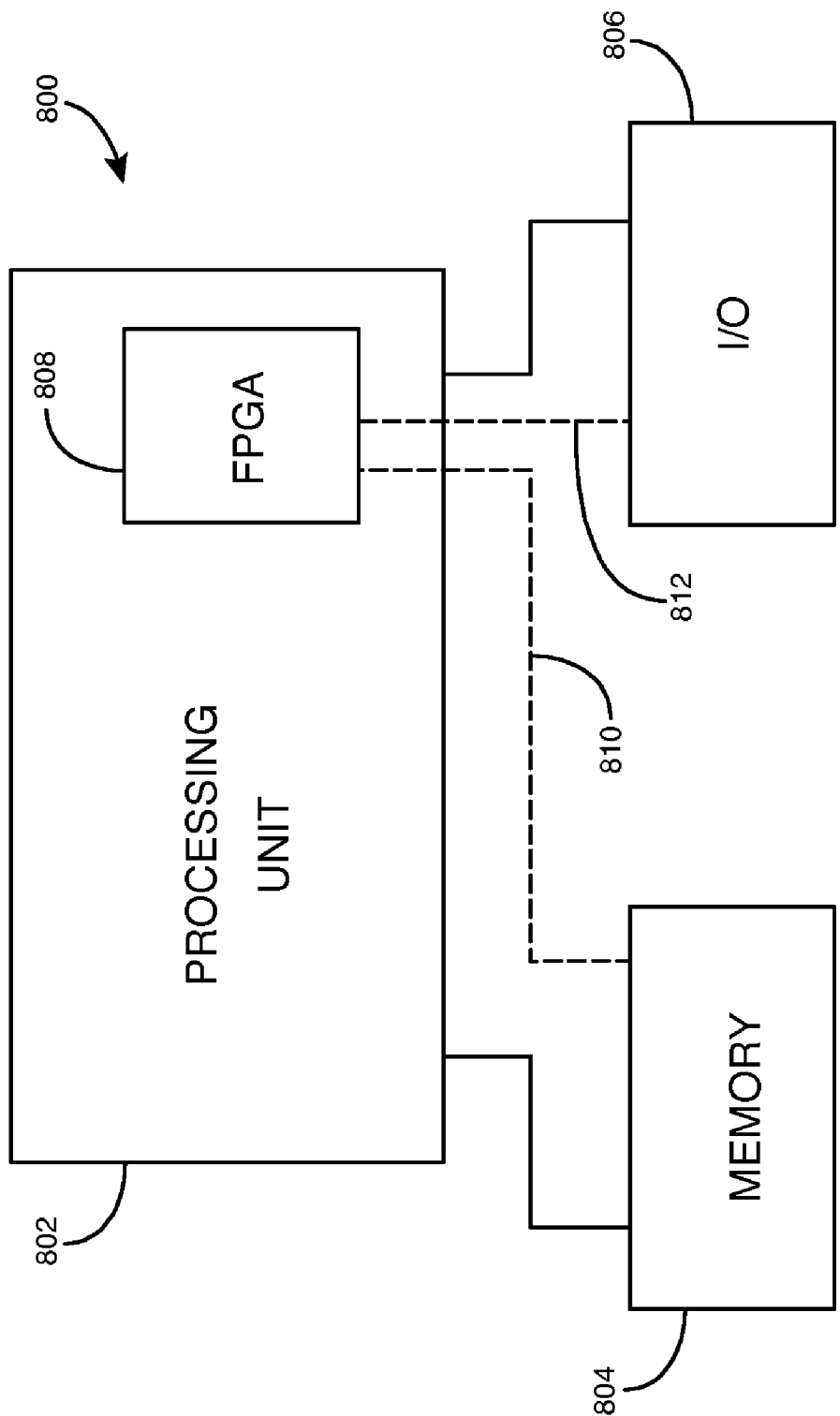
FIG. 8 shows a block diagram of an exemplary digital system that can embody techniques of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804, and an input/output (I/O) unit 806 interconnected together by one or more buses. According to this exemplary embodiment, an FPGA 808 is embedded in processing unit 802. FPGA 808 can serve many different purposes within the system of FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804, receive and transmit data via I/O unit 806, or other similar functions. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternatively, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A digital loop filter comprising:
    a fine control circuit operable to adjust a phase of a feedback clock signal by a first phase adjustment in response to a first phase error signal indicative of a phase error between a reference clock signal and the feedback clock signal;
    a medium control circuit operable to adjust the phase of the feedback clock signal by a second phase adjustment in response to a second phase error signal, wherein the second phase adjustment is larger than the first phase adjustment, and the second phase error signal is indicative of a phase error between the reference clock signal and the feedback clock signal;
    a band control circuit operable to adjust a frequency of the feedback clock signal in response to a first frequency error signal; and
    a capacitor array comprising capacitors arranged in rows and columns, wherein bits stored in the band control circuit determine a selected row of capacitors in the capacitor array, and wherein bits stored in the medium control circuit control switches that are coupled to the capacitors in the selected row.

2. The digital loop filter defined in claim 1, wherein the fine control circuit is operable to generate fine control signals for changing a capacitance at a node in a clock signal generation circuit in response to the first phase error signal to adjust the phase of the feedback clock signal, and
    wherein the medium control circuit is operable to generate medium control signals for changing conductive states of the switches that are coupled to the capacitors in the selected row to change a capacitance at a node in the clock signal generation circuit in response to the second phase error signal to adjust the phase of the feedback clock signal.

3. The digital loop filter defined in claim 2 further comprising:
    a serial finite impulse response filter operable to adjust the phase of the feedback clock signal in response to the first phase error signal by a third phase adjustment that is smaller than the first phase adjustment, wherein the serial finite impulse response filter is operable to affect changes in the phase of the feedback clock signal by changing a capacitance at a node in the clock signal generation circuit, and wherein the fine control circuit is operable to generate the first phase adjustment independently of the third phase adjustment.

4. The digital loop filter defined in claim 1, wherein the fine control circuit comprises a first shift register;
    wherein the medium control circuit comprises a second shift register, wherein the medium control circuit is operable to adjust the phase of the feedback clock signal in response to the second phase error signal and in response to a third phase error signal, wherein the second phase error signal is indicative of the feedback clock signal being ahead of the reference clock signal by at least a phase difference, and the third phase error signal is indicative of the feedback clock signal being behind the reference clock signal by at least the phase difference; and
    wherein the band control circuit comprises a third shift register, wherein the band control circuit is operable to adjust the frequency of the feedback clock signal in response to the first frequency error signal and in response to a second frequency error signal, wherein the first frequency error signal is indicative of the feedback clock signal being ahead of the reference clock signal by at least a frequency difference, and the second frequency error signal is indicative of the feedback clock signal being behind the reference clock signal by at least the frequency difference.

5. The digital loop filter defined in claim 4, wherein changing all bits stored in the first shift register is operable to generate a frequency difference in the feedback clock signal that equals a frequency difference in the feedback clock signal caused by changing two bits stored in the second shift register.

6. The digital loop filter defined in claim 2,
    wherein the band control circuit is operable to generate band control signals that change the selected row of capacitors in the capacitor array for changing a capacitance at a node in the clock signal generation circuit in response to the first frequency error signal to adjust the frequency of the feedback clock signal.

7. The digital loop filter defined in claim 1 further comprising:
    a finite impulse response filter comprising a shift register configured to store digital bits, wherein the finite impulse response filter is operable to change the logic states of the digital bits in response to the logic state of the first phase error signal, wherein the finite impulse response filter is operable to activate a first output signal in response to a number of the digital bits having a first logic state reaching a first threshold, and wherein the finite impulse response filter is operable to activate a second output signal in response to a number of the digital bits having a second logic state reaching a second threshold.

8. The digital loop filter defined in claim 7, wherein the first threshold of the finite impulse response filter is programmable, the second threshold of the finite impulse response filter is programmable, and a maximum number of bits storable in the finite impulse response filter is programmable.

9. The digital loop filter defined in claim 4, wherein the first shift register is operable to shift signals having a first state in a first direction through the first shift register in response to the first phase error signal indicating that a phase error between the reference clock signal and the feedback clock signal is positive, wherein the first shift register is operable to shift signals having a second state in a second direction through the first shift register in response to the first phase error signal indicating that a phase error between the reference clock signal and the feedback clock signal is negative, wherein the second shift register is operable to shift signals having the first state in a first direction through the second shift register in response to the second phase error signal indicating that a phase error between the reference clock signal and the feedback clock signal is positive, and wherein the second shift register is operable to shift signals having the second state in a second direction through the second shift register in response to the third phase error signal indicating that a phase error between the reference clock signal and the feedback clock signal is negative.

10. The digital loop filter defined in claim 2 further comprising:
a first bubble detect circuit operable to detect a non-monotonicity in the fine control signals; and
a second bubble detect circuit operable to detect a non-monotonicity in the medium control signals.

11. A circuit comprising:
phase detection circuitry operable to compare a phase of a reference clock signal to a phase of a feedback clock signal to generate first and second phase error signals;
a filter circuit operable to generate first and second output signals based on the first phase error signal, wherein the filter circuit comprises a shift register, wherein the shift register is operable to activate the first output signal in response to a number of signals having a first state stored in the shift register matching a first threshold and wherein the shift register is operable to activate the second output signal in response to a number of signals having a second state stored in the shift register matching a second threshold;
a fine control circuit operable to adjust the phase of the feedback clock signal by first phase adjustments in response to the first and the second output signals; and
a coarse control circuit operable to adjust the phase of the feedback clock signal by second phase adjustments in response to the second phase error signal, wherein each of the second phase adjustments is larger than each of the first phase adjustments.

12. The circuit defined in claim 11 further comprising:
a clock signal generation circuit, wherein the fine control circuit is operable to generate fine control signals for changing a capacitance at a node in the clock signal generation circuit in response to the first and the second output signals to adjust the phase of the feedback clock signal, and wherein the coarse control circuit is operable to generate coarse control signals for changing a capacitance at a node in the clock signal generation circuit in response to the second phase error signal to adjust the phase of the feedback clock signal.

13. The circuit defined in claim 12 further comprising:
a serial finite impulse response filter operable to adjust the phase of the feedback clock signal in response to the first phase error signal by third phase adjustments, wherein each of the third phase adjustments is smaller than each of the first phase adjustments, wherein the serial finite impulse response filter is operable to affect changes in the phase of the feedback clock signal by changing a capacitance at a node in the clock signal generation circuit.

14. The circuit defined in claim 11, wherein the coarse control circuit further comprises:
a medium control circuit operable to adjust the phase of the feedback clock signal by the second phase adjustments in response to the second phase error signal and in response to a third phase error signal, wherein the second phase error signal is indicative of the feedback clock signal being ahead of the reference clock signal by at least a phase difference, and the third phase error signal is indicative of the feedback clock signal being behind the reference clock signal by at least the phase difference; and
a band control circuit operable to adjust a frequency of the feedback clock signal by frequency adjustments in response to a first frequency error signal and in response to a second frequency error signal, wherein the first frequency error signal is indicative of the feedback clock signal being ahead of the reference clock signal by at least a frequency difference, and the second frequency error signal is indicative of the feedback clock signal being behind the reference clock signal by at least the frequency difference, and wherein a magnitude of each of the frequency adjustments is larger than a magnitude of each of the second phase adjustments.

15. The circuit defined in claim 14, wherein the fine control circuit comprises a first shift register, the medium control circuit comprises a second shift register, and the band control circuit comprises a third shift register.

16. The circuit defined in claim 14, wherein the fine control circuit is operable to generate fine control signals for changing a capacitance at a node in a clock signal generation circuit in response to the first and the second output signals to adjust the phase of the feedback clock signal,
wherein the medium control circuit is operable to generate medium control signals for changing a capacitance at a node in the clock signal generation circuit in response to the second phase error signal and in response to the third phase error signal to adjust the phase of the feedback clock signal, and
wherein the band control circuit is operable to generate band control signals for changing a capacitance at a node in the clock signal generation circuit in response to the first frequency error signal and in response to the second frequency error signal to adjust the frequency of the feedback clock signal.

17. The circuit defined in claim 12, wherein the circuit is a digital phase-locked loop, the phase detection circuitry comprises a phase frequency detector, and the clock signal generation circuit is a digitally controlled oscillator.

18. The circuit defined in claim 17, wherein the digital phase-locked loop is fabricated on a programmable logic integrated circuit.

19. A method for adjusting a feedback clock signal, the method comprising:
- generating a first phase error signal indicative of a sign of a phase error between a reference clock signal and a feedback clock signal;
- generating a second phase error signal indicative of a magnitude of a phase error between the reference clock signal and the feedback clock signal;
- adjusting a phase of the feedback clock signal by a first phase adjustment in response to the first phase error signal based on shifting signals through a first shift register in a loop filter to adjust a capacitance at a node;
- adjusting the phase of the feedback clock signal by a second phase adjustment in response to the second phase error signal based on shifting signals through a second shift register in the loop filter, wherein the second phase adjustment is larger than the first phase adjustment; and
- adjusting a frequency of the feedback clock signal in response to a first frequency error signal based on shifting signals through a third shift register in the loop filter, wherein the signals stored in the third shift register determine a selected row of capacitors in a capacitor array, wherein the capacitor array comprises capacitors arranged in rows and columns, and wherein the signals stored in the second shift register control switches that are coupled to the capacitors in the selected row.

20. The method defined in claim 19 further comprising:
- adjusting the phase of the feedback clock signal by a third phase adjustment in response to the first phase error signal by shifting signals through a fourth shift register in the loop filter to adjust a capacitance at a node.

21. The method defined in claim 19, wherein adjusting the phase of the feedback clock signal by the second phase adjustment in response to the second phase error signal based on shifting signals through a second shift register in the loop filter further comprises:
- adjusting the phase of the feedback clock signal in response to the second phase error signal and in response to a third phase error signal based on shifting signals through the second shift register, wherein the second phase error signal is indicative of the feedback clock signal being ahead of the reference clock signal by at least a phase difference, and the third phase error signal is indicative of the feedback clock signal being behind the reference clock signal by at least the phase difference; and wherein adjusting the frequency of the feedback clock signal in response to a first frequency error signal based on shifting signals through a third shift register in the loop filter further comprises:
- adjusting the frequency of the feedback clock signal in response to the first frequency error signal and in response to a second frequency error signal based on shifting signals through the third shift register in the loop filter, wherein the first frequency error signal is indicative of the feedback clock signal being ahead of the reference clock signal by at least a frequency difference, and the second frequency error signal is indicative of the feedback clock signal being behind the reference clock signal by at least the frequency difference.

22. The method defined in claim 19 further comprising:
- changing a capacitance at a node in response to the first phase error signal to adjust the phase of the feedback clock signal by a third phase adjustment that is smaller than the first phase adjustment.

23. A digital loop filter comprising:
- a shift register operable to shift signals through the shift register in response to a first phase error signal indicating that a phase error between a reference clock signal and a feedback clock signal, wherein the shift register is operable to activate a first output signal in response to a number of signals having a first state stored in the shift register matching a first threshold, and wherein the shift register is operable to activate a second output signal in response to a number of signals having a second state stored in the shift register matching a second threshold;
- a first control circuit operable to adjust a phase of the feedback clock signal in response to the first and the second output signals of the shift register; and
- a second control circuit operable to adjust a frequency of the feedback clock signal in response to first and second frequency error signals, wherein the first frequency error signal is indicative of when a frequency of the feedback clock signal is greater than a frequency of the reference clock signal, and the second frequency error signal is indicative of when the frequency of the feedback clock signal is less than the frequency of the reference clock signal.

24. The digital loop filter defined in claim 23, wherein the shift register is operable to shift signals having the first state in a first direction through the shift register in response to the first phase error signal indicating that a phase error between the reference clock signal and the feedback clock signal is positive, and wherein the shift register is operable to shift signals having the second state in a second direction through the shift register in response to the first phase error signal indicating that a phase error between the reference clock signal and the feedback clock signal is negative.

25. The digital loop filter defined in claim 24 further comprising:
- a third control circuit operable to adjust the phase of the feedback clock signal in response to second and third phase error signals, wherein the second phase error signal is indicative of when the phase of the feedback clock signal is ahead of a phase of the reference clock signal, and the third phase error signal is indicative of when the phase of the feedback clock signal is behind the phase of the reference clock signal.

26. The digital loop filter defined in claim 25, wherein the third control circuit is operable to cause first increments in the frequency of the feedback clock signal in response to the second phase error signal, the third control circuit is operable to cause first decrements in the frequency of the feedback clock signal in response to the third phase error signal,
- the second control circuit is operable to cause second increments in the frequency of the feedback clock signal in response to the first frequency error signal, and the second control circuit is operable to cause second decrements in the frequency of the feedback clock signal in response to the second frequency error signal, and
- wherein each of the second increments increases the frequency of the feedback clock signal more than each of the first increments, and the each of the second decrements decreases the frequency of the feedback clock signal more than each of the first decrements.

* * * * *